(12) United States Patent
Schmid et al.

(10) Patent No.: US 7,918,936 B2
(45) Date of Patent: Apr. 5, 2011

(54) SYSTEM AND METHOD FOR CRYSTAL GROWING

(75) Inventors: Frederick Schmid, Marblehead, MA (US); Chandra P. Khattak, Danvers, MA (US); David B. Joyce, Marblehead, MA (US)

(73) Assignee: GT Crystal Systems, LLC, Salem, MA (US)

( * ) Notice: Subject to any disclaimer, the term of this patent is extended or adjusted under 35 U.S.C. 154(b) by 837 days.

(21) Appl. No.: 11/875,078

(22) Filed: Oct. 19, 2007

(65) Prior Publication Data

US 2008/0035051 A1 Feb. 14, 2008

Related U.S. Application Data

(62) Division of application No. 11/212,027, filed on Aug. 25, 2005, now Pat. No. 7,344,596.

(51) Int. Cl.
*C30B 29/04* (2006.01)

(52) U.S. Cl. .............. 117/81; 117/82; 117/83; 117/21; 117/25

(58) Field of Classification Search .............. 117/81, 117/82, 83, 21, 25
See application file for complete search history.

(56) References Cited

U.S. PATENT DOCUMENTS

| | | |
|---|---|---|
| 3,653,432 A | 4/1972 | Schmid |
| 3,898,051 A | 8/1975 | Schmid |
| 4,108,236 A | 8/1978 | Salkeld |
| 4,178,986 A | 12/1979 | Smashey |
| 4,190,094 A | 2/1980 | Giamei |
| 4,202,400 A | 5/1980 | Gigliotti, Jr. et al. |
| 4,256,530 A | 3/1981 | Schmid |
| 4,409,451 A | 10/1983 | Taylor |
| 4,461,671 A | 7/1984 | Seifert |
| 4,770,704 A | 9/1988 | Gibson |
| 4,840,699 A | 6/1989 | Khattak et al. |
| 5,116,456 A | 5/1992 | Nestor |
| 5,134,261 A | 7/1992 | Larkin |
| 5,772,761 A | 6/1998 | Petroz |
| 5,863,326 A | 1/1999 | Nause et al. |
| 5,988,257 A | 11/1999 | Hugo |
| 6,146,456 A | 11/2000 | Mizugaki |
| 6,309,461 B1 | 10/2001 | Gianoulakis |
| 6,624,390 B1 | 9/2003 | Motakef |
| 2001/0018960 A1 | 9/2001 | Thompson |
| 2002/0166503 A1 | 11/2002 | Magras et al. |
| 2003/0234092 A1 | 12/2003 | Brinegar |

(Continued)

FOREIGN PATENT DOCUMENTS

FR 2352587 12/1977

(Continued)

OTHER PUBLICATIONS

Extended/Supplementary European Search Report for European Patent Application No. 06802314.2 mailed Jun. 8, 2010. 5 pages.

*Primary Examiner* — Robert M Kunemund
(74) *Attorney, Agent, or Firm* — Wilmer Cutler Pickering Hale and Dorr LLP

(57) ABSTRACT

To reduce the heat input to the bottom of the crucible and to control heat extraction independently of heat input, a shield can be raised between a heating element and a crucible at a controlled speed as the crystal grows. Other steps could include moving the crucible, but this process can avoid having to move the crucible. A temperature gradient is produced by shielding only a portion of the heating element; for example, the bottom portion of a cylindrical element can be shielded to cause heat transfer to be less in the bottom of the crucible than at the top, thereby causing a stabilizing temperature gradient in the crucible.

10 Claims, 5 Drawing Sheets

U.S. PATENT DOCUMENTS

| | | |
|---|---|---|
| 2004/0016743 A1 | 1/2004 | Motakef |
| 2004/0192015 A1 | 9/2004 | Ammon et al. |
| 2004/0194692 A1 | 10/2004 | Nishikawa et al. |

FOREIGN PATENT DOCUMENTS

| | | |
|---|---|---|
| JP | 2000-290096 | 10/2000 |
| JP | 02001072492 A | 3/2001 |
| JP | 2004262723 A | 9/2004 |

SYSTEM AND METHOD FOR CRYSTAL GROWING

CROSS-REFERENCE TO RELATED APPLICATIONS

This application is a divisional of, and claims the benefit under 35 U.S.C. §121 of U.S. patent application Ser. No. 11/212,027, filed Aug. 25, 2005 now U.S. Pat. No. 7,344,596 and entitled "System and Method for Crystal Growing," the entire contents of which are incorporated herein by reference.

BACKGROUND

The systems and methods described here relate to systems and methods for producing crystals.

Materials grown in single crystal form in an as-grown state are typically referred to as boules, while materials in multicrystalline form are referred to as multicrystalline ingots. At times, boules and ingots are collectively referred to as crystals. In this document, the term "crystals" is intended to include at least boules and ingots collectively, and, in some instances, boules and ingots may be referred to separately to demonstrate distinctions between single crystal and multicrystalline materials.

For crystal growth in some systems it can be desirable to grow crystals, such as sapphire or silicon, from the bottom to the top of a crucible that holds a molten material. The bottom of the furnace should therefore be cooler than the top, preferably with a stabilizing temperature gradient that minimizes convection and avoids constitutional supercooling. The material in the crucible can solidify from the bottom to the top due to the vertical gradient. This process helps to achieve directional solidification and thereby rejection of impurities to the melt for impurities having a segregation coefficient of less than 1 (very rarely do impurities have a segregation coefficient greater than 1. The process thereby produces a purer solid. In case of silicon, the segregation coefficient of Fe is $10^{-6}$ and for refractory metals it is even less than $10^{-9}$; consequently, directional solidification can be an effective purification process. For reactions with the melt resulting in volatile product, the gases can be rejected upwardly through the melt so it can escape.

SUMMARY

To reduce the heat input to the bottom of the crucible and to control heat extraction independently of heat input, a shield can be raised between a heating element and a crucible at a controlled speed as the crystal grows, preferably without moving the crucible, but this process can be performed with a movable crucible. A temperature gradient is produced by shielding only a portion of a heating element; for example, the bottom portion of a cylindrical element can be shielded to cause heat transfer from the heating element to be less to the bottom of the crucible than at the top, thereby promoting controlled solidification of the charge in the crucible from the bottom upwards and causing a stabilizing temperature gradient in the crucible. Other features and advantages will become apparent from the following description, drawings, and claims

DESCRIPTION

Figure 1:
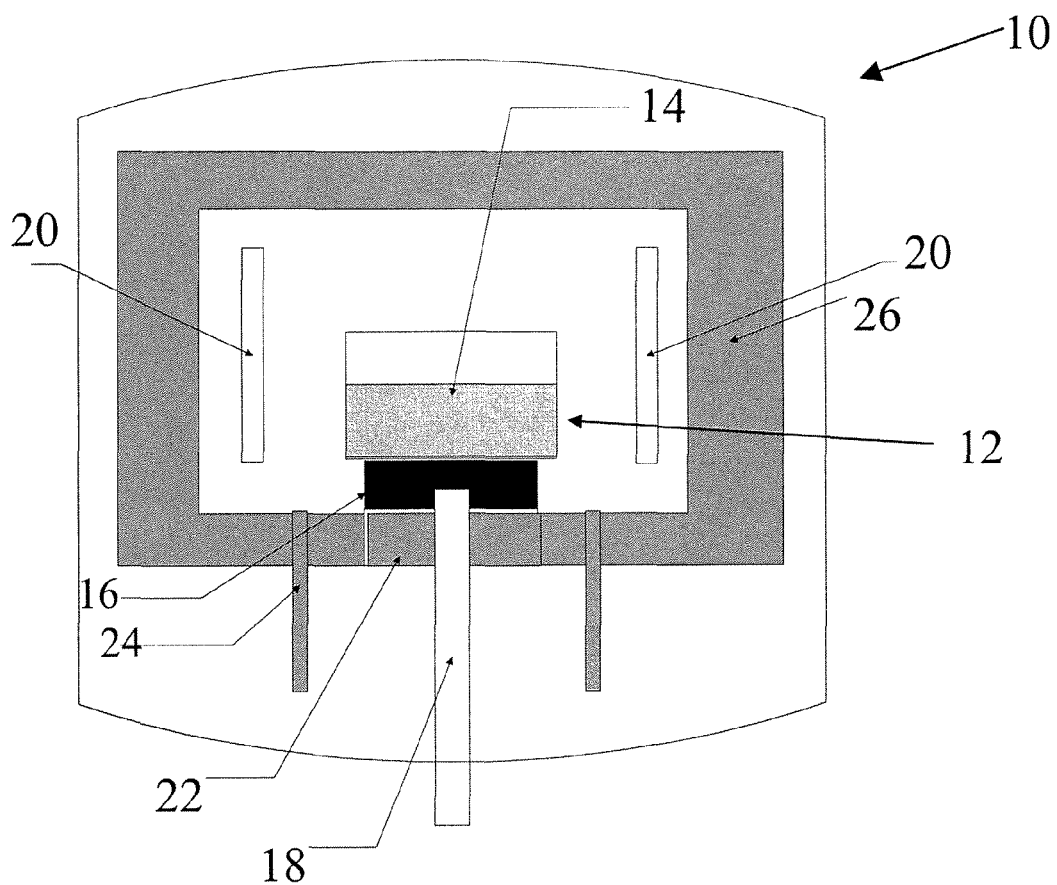
FIGS. 1(a)-1(c) are cross-sectional views of a furnace used to produce multicrystalline ingots.
Figure 1:
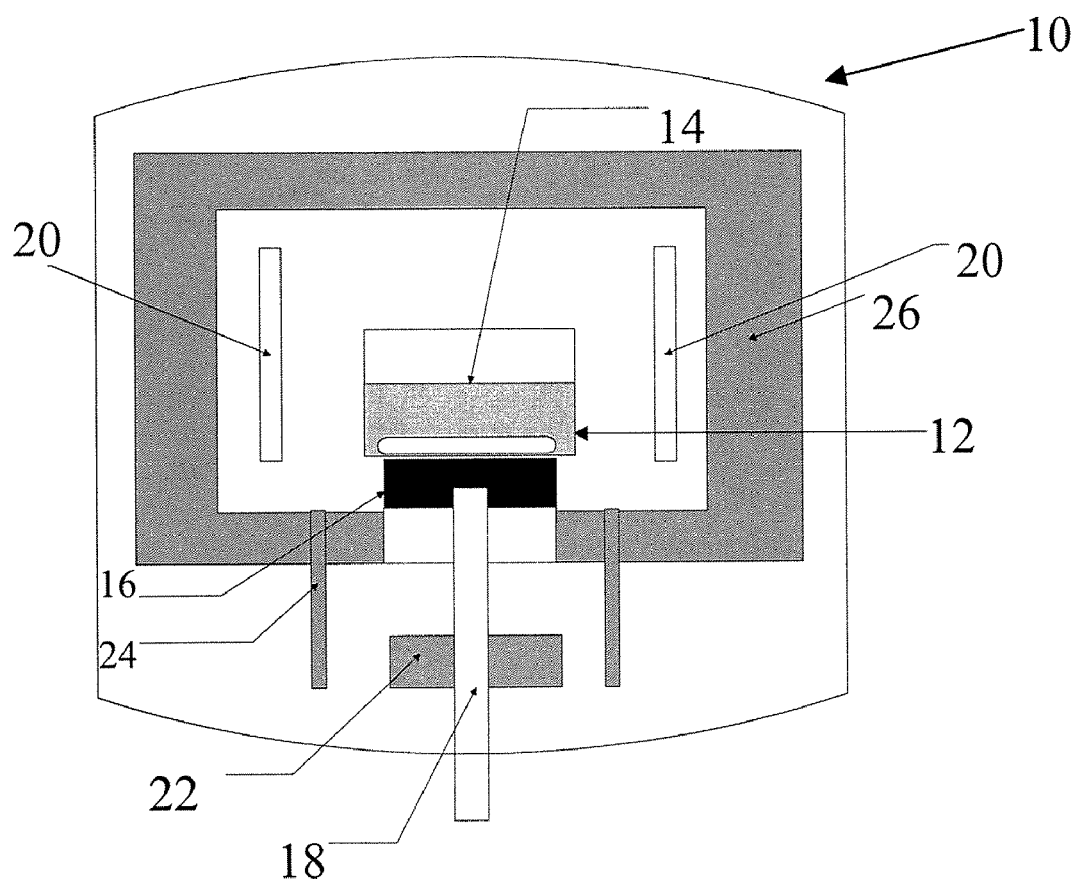
Figure 1:
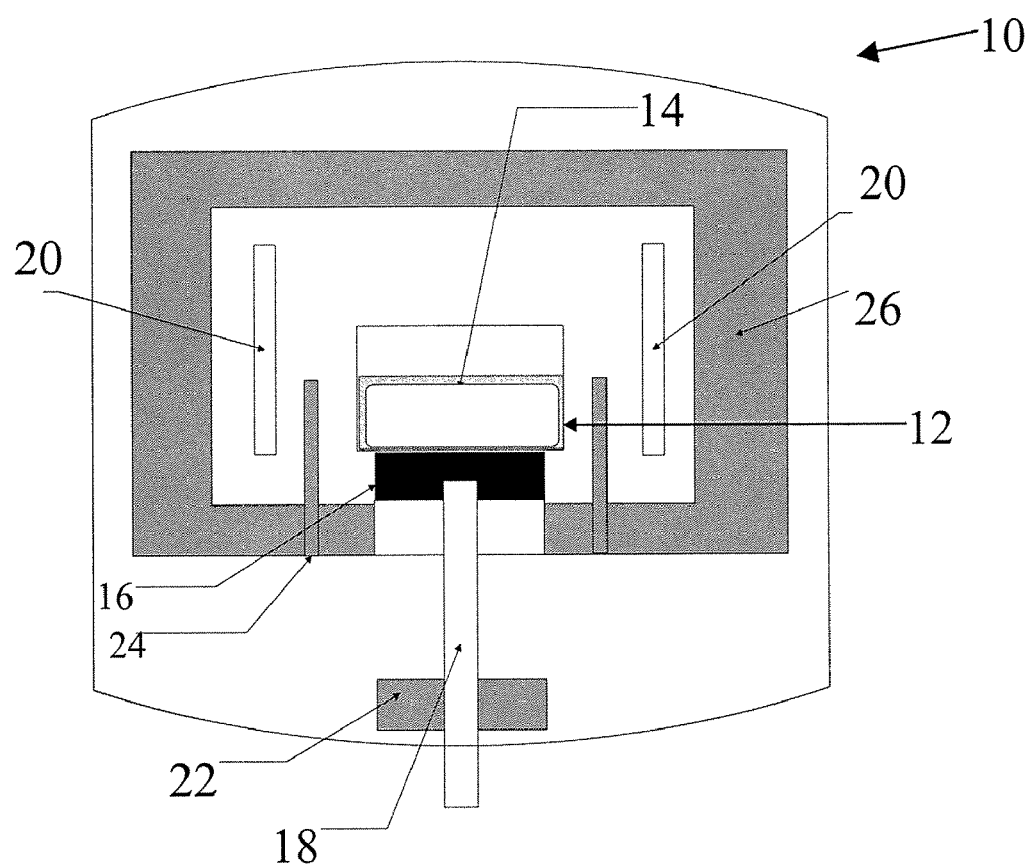

Crystal growth in a crucible is driven by heat flow. In the systems and methods described here, both heat input and heat extraction are controlled. The heat input is controlled by heat transfer from a heating element to contents in the crucible, which depends on the difference in temperature between the heating element and the outside of the crucible. Heat extraction from a heat zone of a furnace can be controlled by increasing heat extraction at the bottom of the furnace, e.g., by lowering insulation to increase heat loss to lower the temperature, or by using a heat exchanger to extract heat to produce a temperature gradient in the heat zone.

One previously known method to reduce the temperature in the bottom of the crucible is to move a crucible out of a heat zone and into a cooler area, e.g., by lowering the crucible out of the heat zone. Moving the crucible can be difficult at high temperature and with a heavy crucible, and can cause vibrations and perturbations at the solid/liquid interface.

To reduce the heat input to the bottom of the crucible and to control heat extraction independently of heat input, a shield can be raised between a heating element and a crucible at a controlled speed as the crystal grows. Other steps could include moving the crucible, but this process can avoid having to move the crucible. Heat input to the charge is reduced by shielding only a portion of the heating element; for example, the bottom portion of a cylindrical element can be shielded to cause the heat transfer from the heating element to be less to the bottom of the crucible, thereby promoting solidification near the bottom of the molten charge and promoting the solidification in a controlled manner (directional solidification) by moving the heat shields upward at a controlled rate.

The heat extraction can be controlled independently of the heat input by lowering the insulation or by using a heat exchanger as currently used is the Heat Exchanger Method (HEM) by Crystal Systems, Inc. With the HEM method, the heat input is decreased without moving the crucible and the heat extraction is independently controlled.

The HEM method of crystal growth is described in U.S. Pat. No. 3,898,051 for single crystals such as sapphire, germanium, and III/V compounds; U.S. Pat. No. 4,256,530 for silicon crystal growth; U.S. Pat. No. 4,840,699 for GaAs crystal growth; and in U.S. Pat. No. 3,653,432. These approaches include independent control of temperature gradients in the liquid and the solid during crystal growth without moving the heat zone, crystal, or crucible. While this description focuses primarily on the HEM method, it is applicable to other techniques in which growth occurs from the bottom to the top of a melt, such as Vertical Bridgman, Modified Bridgman, Thermal Gradient Freeze (TGF), and Thermal Gradient Technique (TGT).

In the HEM method, a nearly isothermal heat zone was designed in which a high temperature heat exchanger was inserted from the bottom of the chamber. When the charge is melted, a minimal flow of helium gas through the heat exchanger prevents the seed crystal from melting out. The charge is melted and the seed crystal is melted back by superheating the melt above its melting temperature. The helium flow through the heat exchanger is increased, thereby decreasing the heat exchanger temperature and/or by decreasing the furnace temperature to grow the crystal. During most of the growth cycle, the temperature gradients in the liquid are primarily controlled by the furnace temperature and the temperature gradients in the solid by the heat exchanger temperature. These temperatures are controlled independently; hence, this method independently controls temperature gradients in the liquid and solid without the need to move the heat zone, crystal, or crucible. The solid-liquid interface is submerged and therefore any mechanical or thermal perturbations are damped out by surrounding liquid before reaching the solid-liquid interface. It is not necessary to rotate the crucible to minimize the effects of hot/cold spots in the heat zone, although it could be so rotated. After crystal growth, the crystal is still in the heat zone so the furnace temperature can be reduced below the melting point of the material and the temperature gradient imposed by the helium flow through the heat exchanger can be reduced by decreasing the heat flow. Under these conditions, the crystal can be in situ annealed to relieve solidification stresses and reduce defect density prior to controlled cooldown of the crystal.

This process has been used to produce large sapphire crystals up to 15 inch (38 cm) diameter, titanium-doped sapphire crystals up to 8 inch (20 cm) diameter, and GaAs crystals up to 4 inch (10 cm) diameter. When a square cross-section crucible was used to contain the charge, square cross-section crystals were produced even though the heat zone was cylindrical. This has been demonstrated with silicon.

For isotropic materials, such as silicon, single crystal growth may not be necessary and in some applications multicrystalline ingots with controlled grain size and orientation are comparable in performance. For example, high-quality single crystal silicon is desired for most semiconductor devices for the microelectronics industry, but for photovoltaic (PV) applications high-quality multicrystalline silicon can be used for most applications. For this application, the cost and high volume production are important, and a slight compromise in quality can be tolerated. Therefore, the PV devices for terrestrial applications tend to use large multicrystalline silicon ingots.

Referring to FIG. 1(a), a furnace 10 includes furnace insulation 26, and a crucible 12 containing a molten liquid 14. Crucible 12 sits on a support block 16 (e.g., made of graphite), which is in contact with a heat exchanger 18 in the form of a support rod. Around the crucible 12 are one or more heating elements 20. As shown here, a conventional tube heat exchanger was replaced with a movable insulation pack 22 that can be moved relative to block 16. This process can promote rapid growth. All the charge can be melted and insulation pack 22 under crucible 12 is lowered (FIG. 1(b)) so that heat is radiated from the graphite block to the cooler sections of the chamber. Under these conditions, a planar solid-liquid interface can be generated and the orientation of the grain boundaries can be nearly vertical.

With this approach, large multicrystalline silicon ingots were produced with centimeter-size grains, vertical orientation of the grain boundaries, and no impinging interfaces which resulted in producing high-efficiency solar cells comparable to those produced using single crystal silicon. In this process, the heat extraction took place through the entire bottom of the crucible. As the crucible size is increased, the heat extraction area increases as well.

In another process, the crucible was also lowered in the heat zone during the growth cycle to help grow taller multicrystalline silicon ingots. After the growth was completed, the furnace temperature was reduced below the melting point of silicon, and the crucible and the insulation pack were moved back up to their original position to achieve in situ annealing of the ingot prior to cooldown. This resulted in producing ingots up to 69-cm square cross-section up to 300-kg at low cost. The system can be used to produce ingots or boules of 300 kg and greater.

Lowering the crucible in the heat zone promotes heat extraction, but the ingot is not lowered beyond where the gradients on the solid increase to impose stress on the ingot. The ingot in its lowered state is still subjected to heat transfer from the heating element to top of the ingot, which has to be removed by the heat extraction system. Therefore, large temperature gradients can be generated by the high heat input and the heat extractions.

Figure 2:
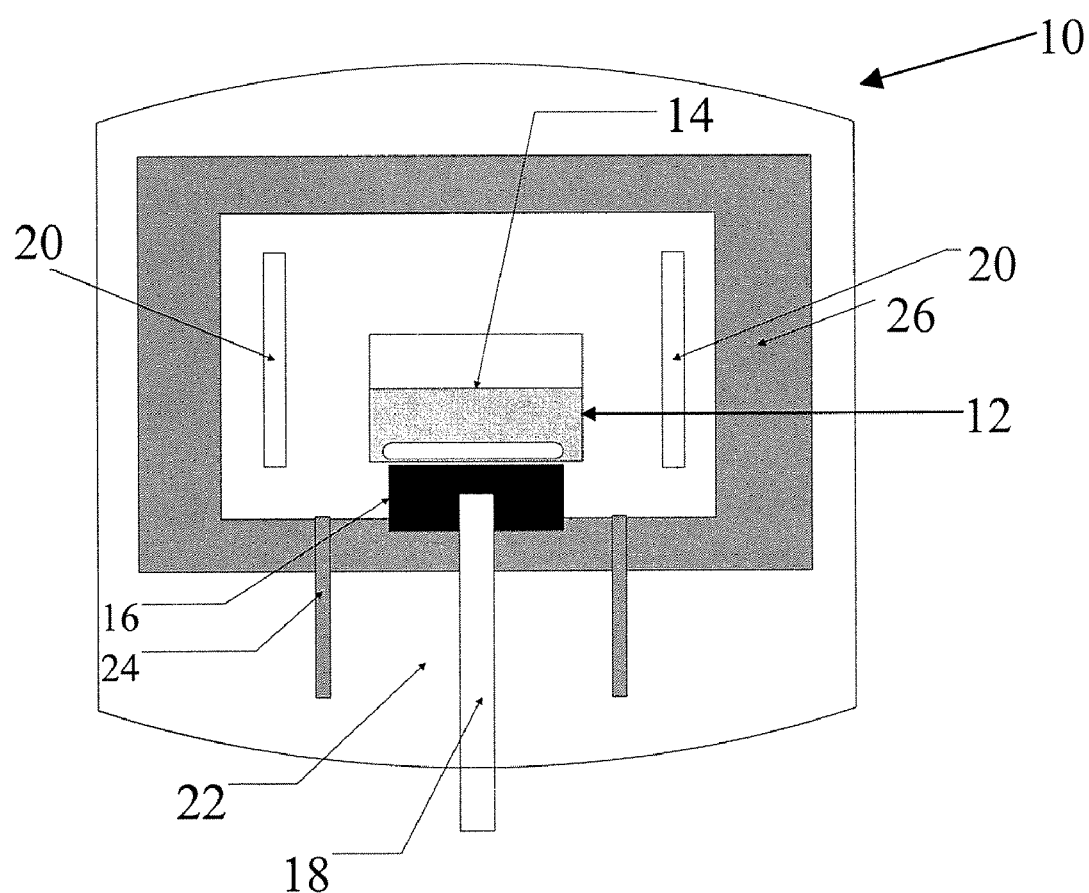
FIGS. 2(a)-2(b) are cross-sectional views of a furnace used to produce single crystal boules.
Figure 2:
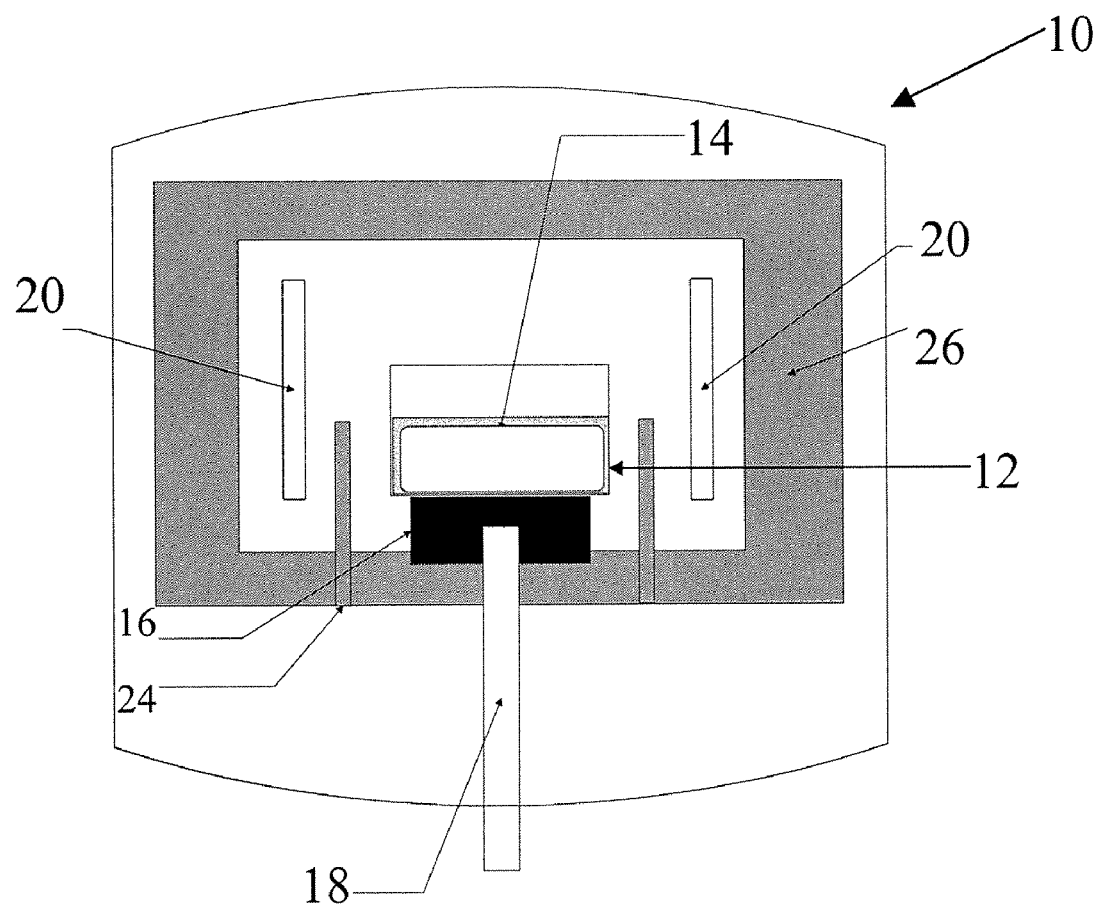

The process of FIGS. 2(a)-2(b) is similar to FIGS. 1(a)-1(c).

There are similarities in the two approaches of FIGS. 1(a)-1(c) and 2(a)-2(b), with the main difference being in the shape of the solid-liquid interface during growth, and that FIGS. 2(a)-2(b) may not include an insulation pack or may be of smaller size consistent with the size of the seed crystal. For single crystal growth, a hemispherical profile is achieved to allow nucleation and growth off a small seed crystal. For multicrystalline growth, a slightly convex nearly planar growth interface covering most of the bottom of the crucible allows formation of large grains with nearly vertical orientation of grain boundaries.

After the charge is melted under the controlled atmosphere desired for the material for growth of multicrystalline ingots, the movable insulation pack is lowered to promote heat extraction from the block and the melt. In the case of single crystal boules, heat extraction is promoted by lowering the smaller insulation pack and/or increasing the flow of helium gas through a heat exchanger without the insulation pack.

Referring to FIGS. 1(c) and 2(b), to sustain growth in both cases, a movable heat shield 24 positioned between the heating element and the crucible can be moved upward so that the heat input to the charge is reduced as the heat shield is moved upward in the heat zone. As the shielding is raised the heat input is decreased and therefore reasonable growth rates are maintained without the requirement of considerably more heat extraction.

The heat extraction at the bottom of the crucible can be increased by decreasing either the heat exchanger temperature or by lowering the insulation under the crucible before, after, or while the shielding is raised. The rate of movement of the heat shields can be independently controlled to control both heat input and heat extraction from the bottom of the crucible to achieve the most favorable crystal growth condition. Under these conditions, a convex interface can be maintained.

Therefore, the temperature gradients in the liquid and the solid are reduced and higher quality crystals can be produced at a faster growth rate. An additional advantage is that larger diameter and taller ingots/boules can be grown without introducing additional stress and causing spurious nucleation.

After the solidification is complete, the furnace temperature can be reduced below the melting point of the material and the heat shield can be lowered to its original position and heat exchanger turned off or insulation under the crucible raised to remove temperature gradient for in situ annealing of the crystal. The crystal is then cooled to room temperature at a rate that does not introduce stress in the boule or ingot.

In addition to the component shown in FIGS. 1(a)-1(c) and 2(a)-2(b), the system would also typically include a number of sensors, and would typically include a controller, such as a microprocessor-based computer or some other method for controlling the movement of the shield or insulation pack.

Having described certain embodiments, it should be apparent that modifications can be made without departing from the scope of the invention as defined by the appended claims.

What is claimed is:

1. A method of growing crystals from a liquid in a crucible, said method comprising:

heating the crucible with a heating element;

extracting heat from the crucible using a heat exchanger in thermal contact with the crucible; and moving a movable shield relative to the heating element and the crucible over a range of positions to reduce heat provided to portions of the crucible, the moving and extracting causing the crystal to solidify along a desired direction.

2. The method of claim 1, wherein the extracting heat from the crucible includes moving insulation away from the support block.

3. The method of claim 1, further comprising positioning the crucible on a support structure such that the crucible is supported from below and is not moved during the crystal growing process.

4. The method of claim 1, further comprising independently controlling movement of the heat exchanger, an output of the heating element, and a position of the movable shield.

5. The method of claim 1, wherein the heat exchanger moves away from the support structure, and thereafter the movable shield is moved to a position between the at least one heating element and the crucible.

6. The method of claim 1, wherein the crucible is enclosed in a housing with a floor under the crucible, the moving including moving the shield through one or more openings in the floor.

7. The method of claim 1, wherein the resulting crystal is at least about 300 kg.

8. The method of claim 1, wherein the resulting crystal comprises a multicrystalline crystal.

9. The method of claim 1, wherein the resulting crystal comprises a single crystal.

10. The method of claim 1, wherein the method is performed without moving the crucible.

* * * * *